United States Patent
Huang et al.

(10) Patent No.: US 11,250,800 B2
(45) Date of Patent: Feb. 15, 2022

(54) SHIFT REGISTER UNIT AND DRIVING METHOD THEREOF, AND GATE DRIVING CIRCUIT, DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yao Huang, Beijing (CN); Yang Zhou, Beijing (CN); Gen Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 16/650,593

(22) PCT Filed: Apr. 2, 2019

(86) PCT No.: PCT/CN2019/081019
§ 371 (c)(1),
(2) Date: Mar. 25, 2020

(87) PCT Pub. No.: WO2020/199124
PCT Pub. Date: Oct. 8, 2020

(65) Prior Publication Data
US 2021/0241706 A1    Aug. 5, 2021

(51) Int. Cl.
*G09G 5/00* (2006.01)
*G09G 3/36* (2006.01)
*G11C 19/28* (2006.01)

(52) U.S. Cl.
CPC .......... *G09G 3/3614* (2013.01); *G09G 3/3674* (2013.01); *G11C 19/28* (2013.01); *G09G 2310/0286* (2013.01)

(58) Field of Classification Search
CPC .............. G09G 3/3614; G09G 3/3674; G09G 2310/0286; G11C 19/28
See application file for complete search history.

(56) References Cited

U.S. PATENT DOCUMENTS

| | | | | |
|---|---|---|---|---|
| 6,373,307 B1 * | 4/2002 | Takai | ...................... | G11C 7/222 327/161 |
| 7,283,117 B2 * | 10/2007 | Noda | ................... | G09G 3/3677 345/100 |

(Continued)

FOREIGN PATENT DOCUMENTS

| CN | 102654968 A | * | 9/2012 | ............... G09G 3/20 |
|---|---|---|---|---|
| CN | 103000155 A | * | 3/2013 | |
| CN | 108766381 A | * | 11/2018 | |

*Primary Examiner* — Joe H Cheng
(74) *Attorney, Agent, or Firm* — Dilworth & Barrese, LLP.; Michael J. Musella, Esq.

(57) ABSTRACT

Provided is shift register unit, a gate driving circuit, and a display apparatus. The shift register unit includes an input-sub-circuit, having a first terminal connected to an input signal terminal and a second terminal connected to a terminal of a first control signal; a first output sub-circuit, having a first terminal connected to a third terminal of the input sub-circuit, a second terminal connected to a terminal of a second control signal, and a third terminal connected to a first output terminal; a phase inversion control sub-circuit, having a first terminal connected to the first output terminal, a second terminal connected to a terminal of a third control signal; and a second output sub-circuit, having a first terminal connected to the first output terminal, a second (Continued)

terminal connected to a third terminal of the phase inversion control sub-circuit, and a third terminal connected to a second output terminal.

14 Claims, 9 Drawing Sheets

(56) References Cited

U.S. PATENT DOCUMENTS

| | | | |
|---|---|---|---|
| 8,929,506 B2* | 1/2015 | Ma | G11C 19/28 377/64 |
| 2005/0195179 A1* | 9/2005 | Kobayashi | G09G 3/296 345/204 |
| 2011/0007040 A1* | 1/2011 | John | G09G 3/20 345/204 |
| 2011/0037745 A1* | 2/2011 | Takasugi | H03K 19/018521 345/211 |
| 2011/0169843 A1* | 7/2011 | Sasaki | H01L 21/8221 345/519 |
| 2014/0043311 A1* | 2/2014 | Shao | G09G 3/3611 345/209 |
| 2019/0096307 A1* | 3/2019 | Liang | G11C 19/287 |
| 2020/0105217 A1* | 4/2020 | Zhang | G09G 3/3614 |
| 2020/0160769 A1* | 5/2020 | Fu | G09G 3/20 |
| 2020/0160929 A1* | 5/2020 | Huang | G09G 3/3674 |

* cited by examiner

SHIFT REGISTER UNIT AND DRIVING METHOD THEREOF, AND GATE DRIVING CIRCUIT, DISPLAY APPARATUS

This application is a national stage of PCT/CN2019/081019, filed on Apr. 2, 2019, the content of which in its entirety is herein incorporated by reference.

TECHNICAL FIELD

The present disclosure relates to a shift register unit, a gate driving circuit, a display apparatus and a driving method thereof.

BACKGROUND

In a GOA circuit of related art, in order to meet the requirements of operation of different types of transistors, such as P-type transistors and N-type transistors, in a pixel circuit, the GOA circuit needs to output operating voltages for the above mentioned different types of transistors in an output stage simultaneously. For example, the GOA circuit needs to output low-level signals for turning on the P-type transistors and high-level signals for turning on the N-type transistors, simultaneously.

SUMMARY

For this purpose, the present disclosure provides a shift register unit, a gate driving circuit, a display apparatus and a driving method thereof.

According to one aspect of the present disclosure, it is provided a shift register unit comprising: an input-sub-circuit, having a first terminal connected to an input signal terminal and a second terminal connected to a terminal of a first control signal; a first output sub-circuit, having a first terminal connected to a third terminal of the input sub-circuit, a second terminal connected to a terminal of a second control signal, and a third terminal connected to a first output terminal; a phase inversion control sub-circuit, having a first terminal connected to the first output terminal, a second terminal connected to a terminal of a third control signal; and a second output sub-circuit, having a first terminal connected to the first output terminal, a second terminal connected to a third terminal of the phase inversion control sub-circuit, and a third terminal connected to a second output terminal; wherein the second output sub-circuit is configured that when a signal output by the first output sub-circuit changes from a valid level to an invalid level, a signal output by the second output sub-circuit changes from the invalid level to the valid level.

In some embodiments, the shift register unit further comprises: an output control sub-circuit, having a first terminal connected to the third terminal of the input sub-circuit, a second terminal connected to the terminal of the first control signal, and a third terminal connected to the first output terminal.

In some embodiments, the shift register unit further comprises: a reset sub-circuit, having a first terminal connected to the third terminal of the input sub-circuit, a second terminal connected to a fourth terminal of the output control sub-circuit.

In some embodiments, the phase inversion control sub-circuit comprises: a first phase inversion control transistor, having a control electrode connected to the first output terminal, a first electrode connected to a terminal of an invalid level signal, and a second electrode connected to the second output sub-circuit; a second phase inversion control transistor, having a control electrode connected to the terminal of the third control signal, a first electrode connected to the second electrode of the first phase inversion control transistor, and a second electrode connected to a terminal of a valid level signal.

In some embodiments, the input sub-circuit comprises: an input transistor, having a control terminal connected to the terminal of the first control signal, a first electrode connected to the input signal terminal, and a second electrode connected to the first terminal of the first output sub-circuit.

In some embodiments, the first output sub-circuit comprises: a first output transistor, having a control terminal connected to the third terminal of the input sub-circuit, a first electrode connected to the first output terminal, and a second electrode connected to the terminal of the second control signal; a first output capacitor, having a first terminal connected to the first output terminal, a second terminal connected to the control terminal of the first output transistor.

In some embodiments, the second output sub-circuit comprises: a second output transistor, having a control terminal connected to the first output terminal, a first electrode connected to a terminal of an invalid level signal, and a second electrode connected to the second output terminal; and a third output transistor, having a control terminal connected to the third terminal of the phase inversion control sub-circuit, a first electrode connected to the second output terminal, and a second electrode connected to a terminal of a valid level signal.

In some embodiments, the second output sub-circuit further comprises: a second output capacitor, having a first terminal connected to the second output terminal, and a second terminal connected to the control terminal of the third output transistor.

In some embodiments, the output control sub-circuit comprises: a first output control transistor, having a control terminal connected to the first control signal terminal, a first electrode connected to a terminal of a valid level signal, and a second electrode connected to a fourth terminal of the output control sub-circuit; a second output control transistor, having a control terminal connected to the second electrode of the first output control transistor, a first electrode connected to a terminal of an invalid level signal, and a second electrode connected to the first output terminal; an output control capacitor, having a first terminal connected to the terminal of the invalid level signal, a second terminal connected to the control terminal of the second output control transistor; and a third output control transistor, having a control terminal connected to the third terminal of the input sub-circuit, a first electrode connected to the second electrode of the first output control transistor, and a second electrode connected to the terminal of first control signal terminal.

In some embodiments, the reset sub-circuit comprises: a first reset transistor, having a control terminal connected to the fourth terminal of the output control sub-circuit, a first electrode connected to a terminal of an invalid level signal; and a second reset transistor, having a control terminal connected to the terminal of the second control signal, a first electrode connected to a second electrode of the first reset transistor, and a second electrode connected to the third terminal of the input sub-circuit.

According to another aspect of the present disclosure, it is provided a gate driving circuit having N stages of shift register units cascaded connected, the shift register unit being the above mentioned shift register unit, wherein, an input signal terminal of an i-th stage shift register unit is connected to a first output terminal of an i-1-th stage shift register unit, and N is an integer larger than 2, 1<i≤N; an input signal terminal of a first stage shift register unit is connected to a frame input signal control line.

According to another aspect of the present disclosure, it is provided a display apparatus, comprising the gate driving circuit mentioned above.

According to another aspect of the present disclosure, it is provided a driving method used for the shift register unit mentioned above, comprising: in an input phase, the input sub-circuit outputting an input signal to the first terminal of the first output sub-circuit to charge the first output sub-circuit; in an output phase, the first output sub-circuit outputting a first output signal at the first output terminal under the control of the third terminal of the input sub-circuit, the second output sub-circuit outputting a second output signal having an opposite level to the first output signal at the second output terminal under the control of the first output terminal.

In some embodiments, the shift register unit further comprises an output control sub-circuit, having a first terminal connected to the third terminal of the input sub-circuit, a second terminal connected to the first control signal terminal, and a third terminal connected to the first output terminal; and a reset sub-circuit, having a first terminal connected to the third terminal of the input sub-circuit, a second terminal connected to a fourth terminal of the output control sub-circuit, and the driving method further comprises: in a first reset phase, the phase inverse control sub-circuit controlling the second output signal output from the second output terminal to change from the invalid level to the valid level while the first output signal changes from the valid level to the invalid level, wherein the third control signal changes from the invalid level to the valid level while the first output signal changes from the valid level to the invalid level; and in a second reset phase, resetting the first output sub-circuit under the control of the fourth terminal of the output control sub-circuit.

By using the shift register unit, the gate driving circuit, the display apparatus and the driving method thereof provided by the present disclosure, a control signal can be provided through an additional signal line, so that the first output signal outputted at the first output terminal of the shift register unit changes from a valid level to an invalid level, meanwhile the second output signal output from the second output terminal of the shift register unit can be changed from the invalid level to the valid level. With the solution provided by the present disclosure, the shift register unit can simultaneously provide operating signals to different types of transistors in the pixel circuit.

BRIEF DESCRIPTION OF THE DRAWINGS

In order to illustrate the technical solutions of the embodiments of the present disclosure more clearly, the drawings used in the description of the embodiments are briefly introduced below. Obviously, the drawings in the following description are only some embodiments of the present disclosure. Those of ordinary skill in the art can obtain other drawings according to these drawings without paying inventive efforts. The following drawings are not deliberately drawn to scale according to the actual size, and the focus is on illustrating the concept of the present disclosure.

DETAILED DESCRIPTION

Figure 1A:
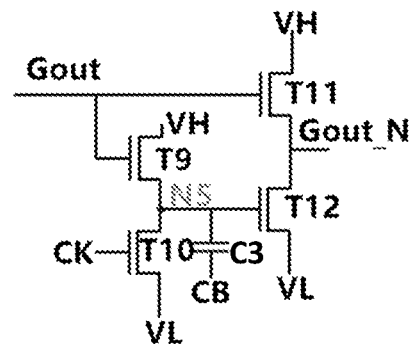
FIG. 1A illustrates an exemplary structure of a shift register unit of the related art.

The technical solutions in the embodiments of the present disclosure will be clearly and completely described below with reference to the accompanying drawings. Obviously, the described embodiments are only part of the embodiments of the present disclosure, but not all of the embodiments. Based on the embodiments of the present disclosure, all other embodiments obtained by a person of ordinary skill in the art without inventive efforts also fall within the protection scope of the present disclosure.

The terms "first", "second", and the like used in this disclosure do not indicate any order, quantity, or importance, but are only used to distinguish different components. Similarly, "comprising" or "including" and similar words mean that the element or object appearing before the word encompasses the element or object appearing after the word and its equivalents without excluding other elements or objects. Terms such as "connecting" or "connected" are not limited to physical or mechanical connections but may include electrical connections directly or indirectly. The terms "up", "down", "left", "right" and the like are only used to indicate relative position relationships. If an absolute position of the described object changes, the relative position relationships may also change accordingly.

As shown in the specification and claims of the present disclosure, unless its context clearly indicates an exception, the words "a", "an", "one" and/or "the" do not specifically refer to a singular number, but may include a plural. In general, the terms "comprising" and "including" do not mean to include explicitly identified steps and elements only, and these steps and elements do not constitute an exclusive list, and the method or device may also include other steps or elements.

The transistors used in all embodiments of the present disclosure may be thin film transistors or field effect transistors or other devices with the similar characteristics. In embodiments of the present disclosure, the connection manner of a drain electrode and a source electrode of each transistor can be interchanged. Therefore, there is actually no difference between the drain electrode and the source electrode of each transistor in the embodiments of the present disclosure. Here, just to distinguish the two electrodes of the transistor except a gate electrode, one of the electrodes is called the drain electrode and the other is called the source electrode. The thin film transistors used in the embodiments of the present disclosure may be N-type transistors or P-type transistors. In the embodiment of the present disclosure, when the N-type thin film transistor is used, a first electrode thereof may be a source electrode, and a second electrode thereof may be a drain electrode. In the following embodiments, illustration is given by taking the thin film transistor as a P-type transistor, that is, when a signal of the gate is a low level, the thin film transistor is turned on. It can be conceived that when an N-type transistor is used instead, the timing sequence of the driving signal needs to be adjusted accordingly. Specific details are not repeated here but should also be within the protection scope of the present disclosure.

FIG. 1A illustrates an exemplary structure of an output portion of a shift register unit according to the related art. The shift register unit is a structure composed of a plurality of P-type transistors. FIG. 1A shows a Gout terminal as a first output terminal of the shift register unit, a VH terminal as a terminal of a high-level signal, a VL terminal as a terminal of a low-level signal, a CK terminal as a terminal of a first control signal, a CB terminal as a terminal of a second control signal, and a Gout_N terminal as a second output terminal of the shift register unit. According to the operational principle of the shift register unit, the first output terminal Gout and the second output terminal Gout_N should always output opposite signals. That is, when the first output terminal Gout outputs a high level, the second output terminal Gout_N outputs the low level. When the first output terminal Gout outputs the low level, the second output terminal Gout_N outputs the high level. In addition, the first control signal CK and the second control signal CB are used to control on and off of the transistors during the operation of the shift register unit.

Figure 1B:
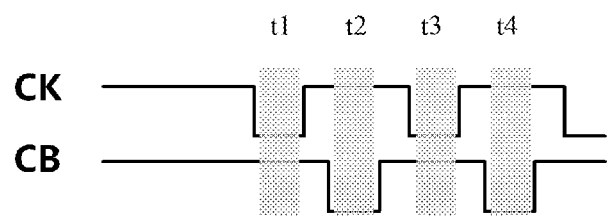
FIG. 1B illustrates the timing sequence of a first control signal CK and a second control signal CB used by the shift register unit in FIG. 1A.

In order to prevent errors from occurring during operations of the shift register unit, the first control signal CK and the second control signal CB are configured not to be at a valid level at the same time. The present disclosure is described by taking the low level as an example of the valid level. FIG. 1B shows timing sequences of the first control signal CK and the second control signal CB used by the output portion of the structure of the shift register unit in FIG. 1A. It can be seen that when the first control signal CK changes from the low level to the high level, the second control signal CB does not change from the high level to the low level immediately. In contrast, after the first control signal CK changes to the high level, the second control signal CB maintains the high level for a period of time and then changes to the low level. With such a setting, it is possible to ensure that the first control signal CK and the second control signal CB are not at the valid level at the same time, thereby errors are prevented from occurring during the operations of the shift register unit.

In the example shown in FIG. 1A, t1 is an input phase, t2 is an output phase, t3 is a first reset phase for resetting the output terminal Gout, and t4 is a second reset output phase for resetting an output sub-circuit (not shown in FIG. 1A). In the period of t2, when the first output terminal Gout of the shift register unit outputs a valid level (for example, the low level), a transistor T9 shown in FIG. 1A is turned on. In addition, as shown in FIG. 1B, the first control signal CK outputs an invalid level during the period of t2, so that a transistor T10 is turned off at this time. Therefore, during the period of t2, a node N5 is connected to the high-level signal terminal VH through the transistor T9, so that the transistor T12 is turned off under the control of N5. Since a transistor T11 is turned on under the control of the first output terminal Gout, the second output terminal Gout_N outputs the high level during the period of t2.

When the period of t2 ends, the output of the first output terminal Gout is reset from the valid level to the invalid level. As shown in FIG. 1B, the second control signal CB changes from a valid low level to an invalid high level, meanwhile the first control signal CK is maintained at the high level, so that a level at the node N5 is increased due to a bootstrap effect by the capacitor C3, and transistor T12 is unable to be turned on. Therefore, when the output of the first output terminal Gout changes from the valid level to the invalid level, the second output terminal Gout_N cannot change from the invalid level to the valid level. Until the first control signal CK changes from the invalid level to the valid level, the transistor T10 is turned on under the control of the first control signal CK, and the level at the node N5 is pulled down to the low-level signal terminal VL, thereby the transistor T12 is enabled to be turned on under the control of the node N5 and pulls the level output from the second output terminal Gout_N to the low level.

Therefore, according to the shift register unit of the related art, when the output of the first output terminal Gout changes from the valid level to the invalid level, the second output terminal Gout_N cannot change from the invalid level to the valid level in time, thus an operating efficiency of the shift register unit is reduced and a charging effect of subsequent nodes is affected.

Figure 1C:
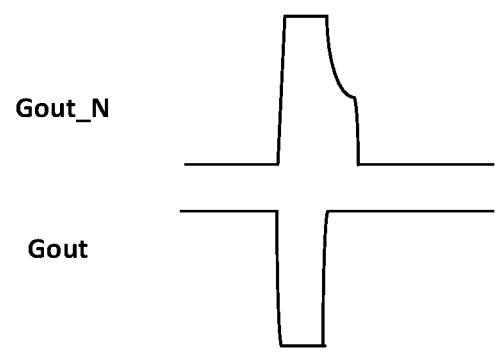
FIG. 1C illustrates an output characteristic of the shift register unit in FIG. 1A.

FIG. 1C illustrates an output characteristic of the shift register unit in FIG. 1A. When the level outputted from the first output terminal Gout changes, the level outputted from the second output terminal Gout_N cannot perform a similar level change accordingly. It can be seen from FIG. 1C that there is a delay in the timing for the signal outputted from the second output terminal Gout_N changing its level. When the signal output from the first output terminal Gout rises from the low level to the high level, the signal output from the second output terminal Gout_N has not yet fallen from the high level to the low level. Therefore, the shift register unit according to the related art cannot provide an accurate output signal.

Figure 2:
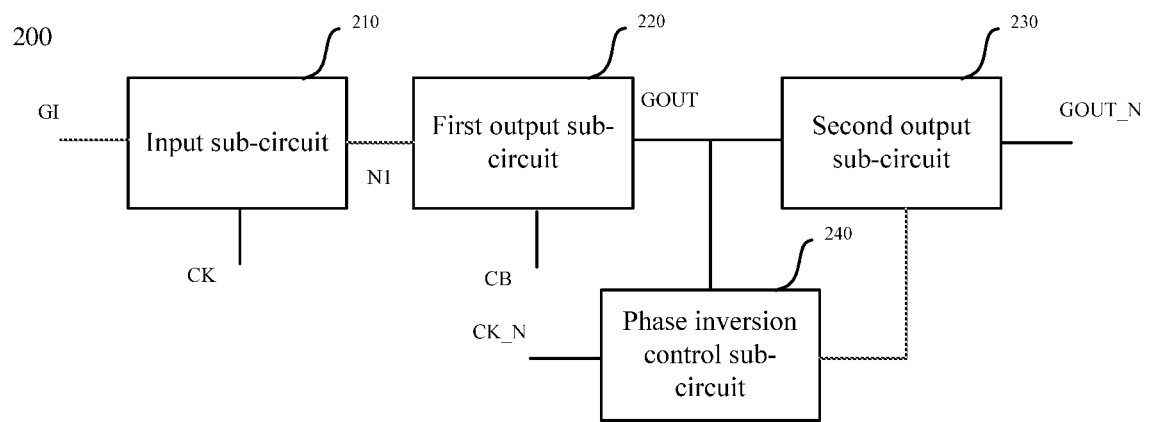
FIG. 2 illustrates a schematic block diagram of a shift register unit according to embodiments the present disclosure.

FIG. 2 shows a schematic block diagram of a shift register unit according to embodiments of the present disclosure. As shown in FIG. 2, the shift register unit 200 may include an input sub-circuit 210, a first output sub-circuit 220, a second output sub-circuit 230, and a phase inversion control sub-circuit 240.

As shown in FIG. 2, a first terminal of the input sub-circuit 210 is connected to an input terminal GI, a second terminal of the input sub-circuit 210 is connected to the terminal of the first control signal CK, and a third terminal of the input sub-circuit 210 is connected to a first control node N1, and the input sub-circuit 210 is configured to output an input signal to the first control node N1 under the control of the signal CK.

A first terminal of the first output sub-circuit 220 is connected to the first control node N1, a second terminal of the first output sub-circuit 220 is connected to the terminal of the second control signal CB, a third terminal of the first output sub-circuit 220 is connected to the first output terminal GOUT, and the first output sub-circuit 220 is configured to output a first output signal at the first output terminal GOUT under the control of the first control node N1.

A first terminal of the second output sub-circuit 230 is connected to the first output terminal GOUT, a second terminal of the second output sub-circuit 230 is connected to the phase inversion control sub-circuit 240, a third terminal of the second output sub-circuit 230 is connected to the second output terminal Gout_N, and the second output sub-circuit 230 is configured to output a second output signal having an opposite level with the first output signal.

A first terminal of the phase inversion control sub-circuit 240 is connected to the first output terminal GOUT, the second terminal of the phase inversion control sub-circuit 240 is connected to the terminal of a third control signal CK_N, the third terminal of the phase inversion control sub-circuit 240 is connected to the second terminal of the second output sub-circuit 230, and the phase inversion control sub-circuit 240 is configured to control the second output sub-circuit 240 to output the second output signal according to the first output signal GOUT and the third control signal CK_N. Therein, while the first output signal GOUT changes from the valid level to the invalid level, the phase inversion control sub-circuit 240 controls the second output signal output from the second output terminal GOUT_N to change from the invalid level to the valid level under the control of the third control signal CK_N.

By using the embodiments provided by the present disclosure, by setting the third control signal CK_N, while the first output signal GOUT changes from the valid level to the invalid level, the shift register unit can be configured to control the second output signal GOUT_N to change from the valid level to the invalid level by using the inversion control sub-circuit, so that the shift register unit can accurately output two output signals with opposite levels.

Figure 3:
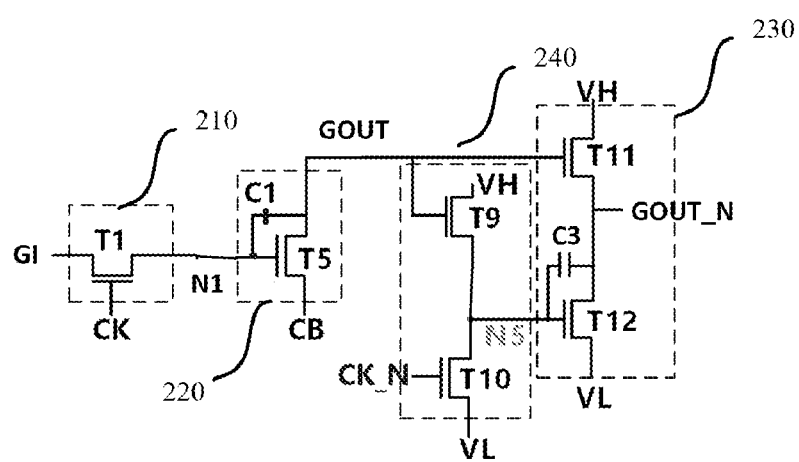
FIG. 3 illustrates an exemplary circuit structure of a shift register unit according to embodiments the present disclosure.

FIG. 3 illustrates an exemplary circuit structure of a shift register unit according to embodiments of the present disclosure. As shown in FIG. 3, in some embodiments, the input sub-circuit 210 may include an input transistor T1 having a control terminal connected to the terminal of the first control signal CK, a first terminal connected to the input terminal GI, and a second terminal connected to the first control node N1. The input transistor T1 is configured to transmit a signal input from the input terminal GI to the first control node N1 under the control of CK. In some embodiments, when GI inputs a low-level turn-on signal, the terminal of the first control signal CK inputs a low-level turn-on signal. The input transistor T1 is turned on under the control of the first control signal CK and transmits the input signal to the first control node N1.

In some embodiments, the first output sub-circuit 220 may include a first output transistor T5 having a control terminal connected to the first control node N1, a first electrode connected to the first output terminal GOUT, and a second electrode connected to the terminal of the second control signal CB. In some embodiments, the first output sub-circuit 220 may further include a first output capacitor C1 having a first terminal connected to the first output terminal GOUT, and a second terminal connected to the first control node N1. For example, when the input transistor T1 transmits a low-level input signal to the first control node N1, the potential of the first control node N1 can be maintained at the low level due to a charge storage function of the first output capacitor C1, and thus the first output transistor T5 can be turned on under the control of the first control node N1 and output the level of the second control signal CB of the second terminal to the first output terminal GOUT. For example, when the first output transistor T5 is turned on under the control of the first control node N1, if the second control signal CB inputs a high-level signal, the first output terminal GOUT will output a high-level signal. If the second control signal CB inputs a low-level signal, the first output terminal GOUT will output a low-level signal.

In some embodiments, the phase inversion control sub-circuit 240 may include a first phase inversion control transistor T9 and a second phase inversion control transistor T10, wherein a control electrode of the first phase inversion control transistor is connected to the first output terminal GOUT, a first electrode of the first phase inversion control transistor is connected to the high-level signal terminal VH, and a second electrode of the first phase inversion control transistor is connected to the third control node N5. A control electrode of the second phase inversion control transistor T10 is connected to the third control signal terminal CK_N, a first electrode of the second phase inversion control transistor is connected to the third control node N5, and a second electrode of the second phase inversion control transistor is connected to the low-level signal terminal VL.

When the first output terminal GOUT outputs the low level, the first phase inversion control transistor T9 is turned on under the control of the first output terminal GOUT, and outputs a signal from the high-level signal terminal VH to the third control node N5. When the signal output from the first output terminal GOUT changes from the low level to a high level, the third control signal terminal CK_N outputs a low-level turn-on signal and controls the second phase inversion control transistor T10 to be turned on, so that the potential of the third control node N5 is pulled down to the low level output from the low-level signal terminal.

In some embodiments, a third phase inversion control transistor (such as a transistor T13 shown in FIG. 5) may be further provided between the first phased inversion control transistor T9 and the second phase inversion control transistor T10. A control terminal of the third phase inversion control transistor is connected to the low-level signal terminal, a first terminal of the third phase inversion control transistor is connected to the second electrode of the first phase inversion control transistor T9, and a second terminal of the third phase inversion control transistor is connected to the first electrode of the second inversion control transistor T10. In other words, the third inversion control transistor is always in a turn-on state, and its role is to prevent the first phase inversion control transistor T9 or the second phase inversion control transistor T10 from being directly connected between the high-level signal terminal and the low-level signal terminal, which resulting that the voltage difference across the first phase inversion control transistor T9 or the second phase inversion control transistor T10 is too large, thereby the service life of the transistors is affected.

In some embodiments, the second output sub-circuit 230 may include a second output transistor T11 and a third output transistor T12. A control terminal of the second output transistor T11 is connected to the first output terminal GOUT, a first electrode of the second output transistor T11 is connected to the high-level signal terminal VH, and a second electrode of the second output transistor T11 is connected to the second output terminal GOUT_N. A control terminal of the third output transistor T12 is connected to the third control node N5, a first electrode of the third output transistor T12 is connected to the second output terminal GOUT_N, and a second electrode of the third output transistor T12 is connected to the low-level signal terminal.

Herein, when the first output terminal GOUT outputs a low-level signal, the second output transistor T11 is turned on under the control of the first output terminal GOUT, so that the signal from the high-level signal terminal VH is output to the second output terminal GOUT_N. As described above, when the first output terminal GOUT outputs a low-level signal, the first phase inversion control transistor T9 is turned on and outputs a high-level signal to the third control node N5. Thus, the third output transistor T12 is turned off at this time. Therefore, when the first output terminal GOUT outputs a low-level signal, the second output terminal GOUT_N outputs a high-level signal.

When the first output terminal GOUT outputs a high-level signal, the second output transistor T11 is turned off under the control of the first output terminal GOUT. In addition, as described above, when the first output terminal GOUT outputs a high-level signal, the third control signal terminal CK_N is at a low level at this time, and the second phase inversion control transistor T10 is turned on and outputs the low-level signal to the third control node N5. Therefore, the third output transistor T12 is turned on at this time. Therefore, when the first output terminal GOUT outputs a high-level signal, the second output terminal GOUT_N outputs a low-level signal.

In some embodiments, the second output sub-circuit further includes a second output capacitor C3 having a first terminal connected to the third control node, and a second terminal connected to the second output terminal.

With the structure of the shift register unit provided by the present disclosure, when the signal output from the first output terminal GOUT changes from a valid level to an invalid level, for example, from a low level to a high level, the phase inversion control circuit may, under the control of the third control signal CK_N, control the signal output from the second output terminal GOUT_N to change from the invalid level to the valid level, for example, from a high level to a low level. Thus, the existing problem that the output signal of the shift register unit is inaccurate can be solved.

Figure 4:
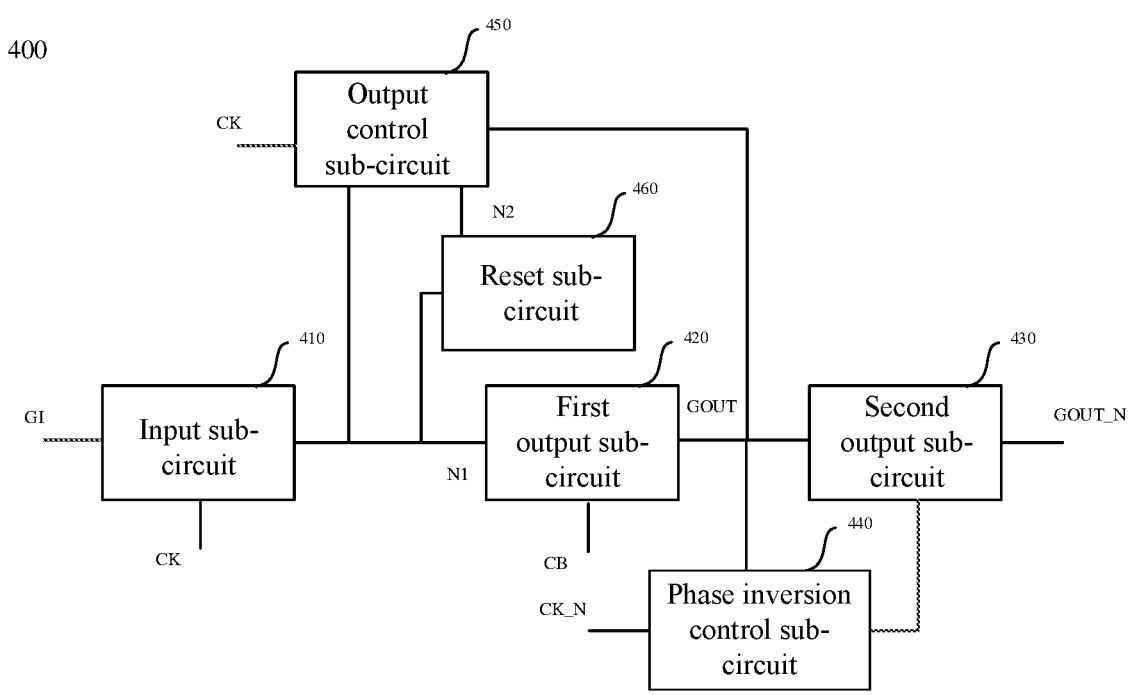
FIG. 4 illustrates a block diagram of another shift register unit according to embodiments the present disclosure.

FIG. 4 shows a schematic block diagram of another shift register unit according to the present disclosure. As shown in FIG. 4, the shift register unit 400 may include an input sub-circuit 410, a first output sub-circuit 420, a second output sub-circuit 430, a phase inversion control sub-circuit 440, an output control sub-circuit 450, and a reset sub-circuit 460. Among them, the input sub-circuit 410, the first output sub-circuit 420, the second output sub-circuit 430, and the phase inversion control sub-circuit 440 may be implemented by the input sub-circuit 210, the first output sub-circuit 220, the second output sub-circuit 230 and the phase inversion control sub-circuit 240 shown in FIGS. 2 to 3, and details are not repeated here.

As shown in FIG. 4, a first terminal of the output control sub-circuit 450 is connected to the first control node N1, a second terminal of the output control sub-circuit 450 is connected to the first control signal CK, and a third terminal of the output control sub-circuit 450 is connected to the first output terminal GOUT. The output control sub-circuit 450 may be configured to control the first output terminal GOUT to output an invalid level under the control of the first control node N1 and the first control signal CK. In some embodiments, in a non-output period, the output control sub-circuit 450 may be configured to output an invalid level to the first output terminal GOUT under the control of the first control node N1 and/or the first control signal CK, so that the output level of the first output terminal GOUT during the operation of the shift register unit can always be controlled.

A first terminal of the reset sub-circuit 460 may be connected to the first control node N1, and a second terminal of the reset sub-circuit 460 is connected to a fourth terminal of the output control sub-circuit 450, that is, a second control node N2 shown in FIG. 4. The reset sub-circuit 460 may be configured to reset the first control node N1 under the control of the second control node N2. In some embodiments, in the reset phase, the reset sub-circuit inputs an invalid level to the first control node N1 under the control of the second control node N2, thereby a reset of the first control node N1 is realized.

By using the shift register unit provided by the present disclosure, the output control sub-circuit and the reset sub-circuit can be used to further control the first output sub-circuit, so that the first output sub-circuit can output the driving signal more accurately.

Figure 5:
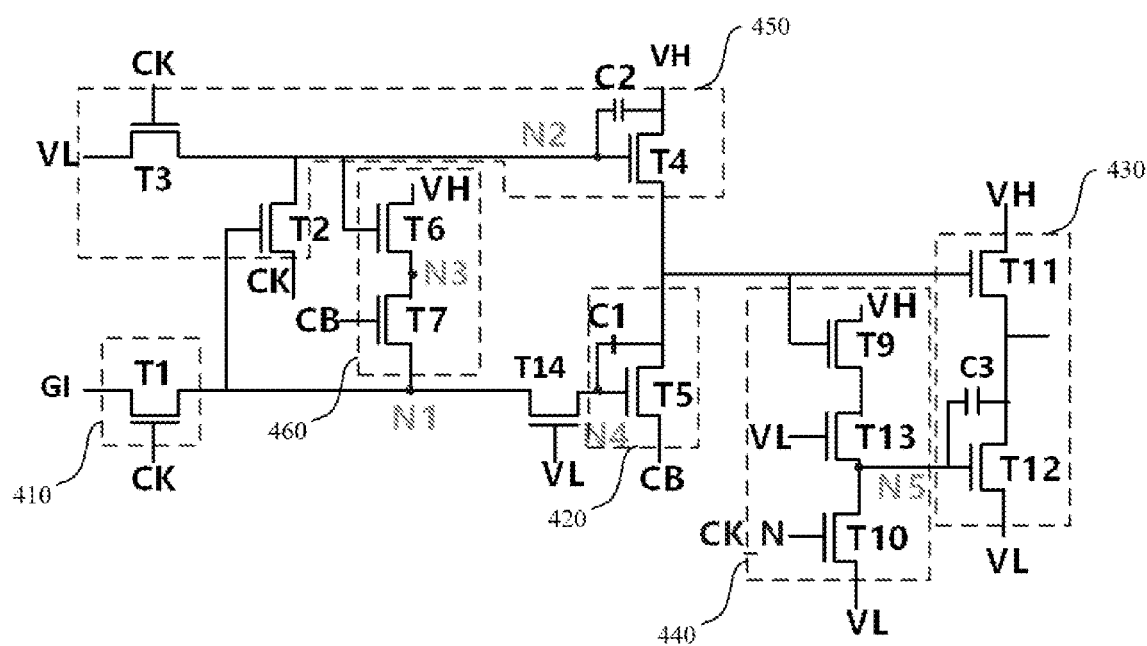
FIG. 5 illustrates an exemplary circuit structure of a shift register unit according to embodiments the present disclosure.

FIG. 5 illustrates an exemplary circuit structure of a shift register unit according to embodiments of the present disclosure. Here, the input sub-circuit 410, the first output sub-circuit 420, the second output sub-circuit 430, and the phase inversion control sub-circuit 440 shown in FIG. 5 may be implemented by the input sub-circuit 210, the first output sub-circuit 220, the second output sub-circuit 230, and the phase inversion control sub-circuit 240 shown in FIG. 3.

It should be noted that, in FIG. 5, a transistor T14 is connected between the input sub-circuit 410 and the first output sub-circuit 420, and a control terminal of the transistor T14 is connected to the low-level signal terminal VL. Therefore, the transistor T14 is always turned on, and its role is to bear a part of the voltage difference in the circuit, so that the voltage difference between the first terminal and the second terminal of the input transistor T1 is reduced, and the service life of the input transistor T1 and an operational stability of the input transistor T1 are increased.

Further, in the phase inversion control sub-circuit 440, a transistor T13 is connected between the first phase inversion control transistor T9 and the second phase inversion control transistor T10, and a control terminal of the transistor T13 is connected to the low-level signal terminal VL. Therefore, the transistor T13 is always turned on. Its role is to bear a part of the voltage difference in the circuit, thereby the voltage difference between the first terminal and the second terminal of the first phase inversion control transistor T9 and the voltage difference between the first terminal and the second terminal of the second phase inversion control transistor T10 are reduced, and the service lives of the first phase inversion control transistor T9 and the second phase inversion control transistor T10 and the operating stability of the first and second phase inversion control transistors T9 and T10 are increased.

As shown in FIG. 5, the input control sub-circuit 450 may include a first output control transistor T3, a second output control transistor T4, a third output control transistor T2, and an output control capacitor C2. A control electrode of the first output control transistor T3 is connected to the terminal of the first control signal CK, a first electrode of the first output control transistor T3 is connected to the terminal of the valid level signal VL, and a second terminal of the first output control transistor T3 is connected to the second control node N2. A control terminal of the second output control transistor T4 is connected to the second control node N2, a first electrode of the second output control transistor T4 is connected to the terminal of the invalid level signal VH, and a second electrode of the second output control transistor T4 is connected to the first output terminal GOUT. A first terminal of the output control capacitor C2 is connected to the terminal of the invalid level signal VH, and a second terminal of the output control capacitor C2 is connected to the second control node N2. A control electrode of the third output control transistor T2 is connected to the first control node N1, the first electrode of the third output control transistor T2 is connected to the second control node N2, and a second electrode of the third output control transistor T2 is connected to the terminal of the first control signal CK.

In some embodiments, during the output stage of the shift register unit, as described above, the first control node N1 is at a low level, and the second control signal CB is also at a low level. Therefore, at this time, the third output control transistor T2 is turned on, and the first control signal CK is at a high level. The high-level signal input by the first control signal CK can be input to the second control node N2 through T2, so that the second output control transistor T4 is turned off under the control of the second control node N2 without affecting an output of the first output terminal GOUT.

In other embodiments, during the non-output stage of the shift register unit, a low-level signal may be input through the first control signal CK, so that the first output control transistor T3 is turned on, and the low-level control signal is input to the second control node N2, so that the second output control transistor T4 is turned on, and an invalid high-level signal is output to the first output terminal GOUT.

Therefore, by using the output control sub-circuit provided in the present disclosure, an invalid signal can be output to the first output terminal GOUT in the non-output stage of the shift register unit, thereby better control of the output signal is achieved.

With reference to FIG. 5, the reset sub-circuit 460 may include a first reset transistor T6 and a second reset transistor T7. A control electrode of the first reset transistor T6 is connected to the second control node N2, and a first electrode of the first reset transistor T6 is connected to the terminal of the invalid level signal VH. A control electrode of the second reset transistor T7 is connected to the terminal of the second control signal CB, a first electrode of the second reset transistor T7 is connected to a second electrode of the first reset transistor T6, and a second electrode is connected to the first control node N1.

In some embodiments, during a reset stage of the shift register unit, the first reset transistor T6 and the second reset transistor T7 may be turned on under the control of the second control signal CB and the second control node N2, and an invalid high-level signal is input to the first control node N1, so that the first control node N1 is reset.

Therefore, by using the reset sub-circuit provided by the present disclosure, the shift register unit can be reset, so that the shift register unit can normally realize the output of the next stage.

Figure 6:
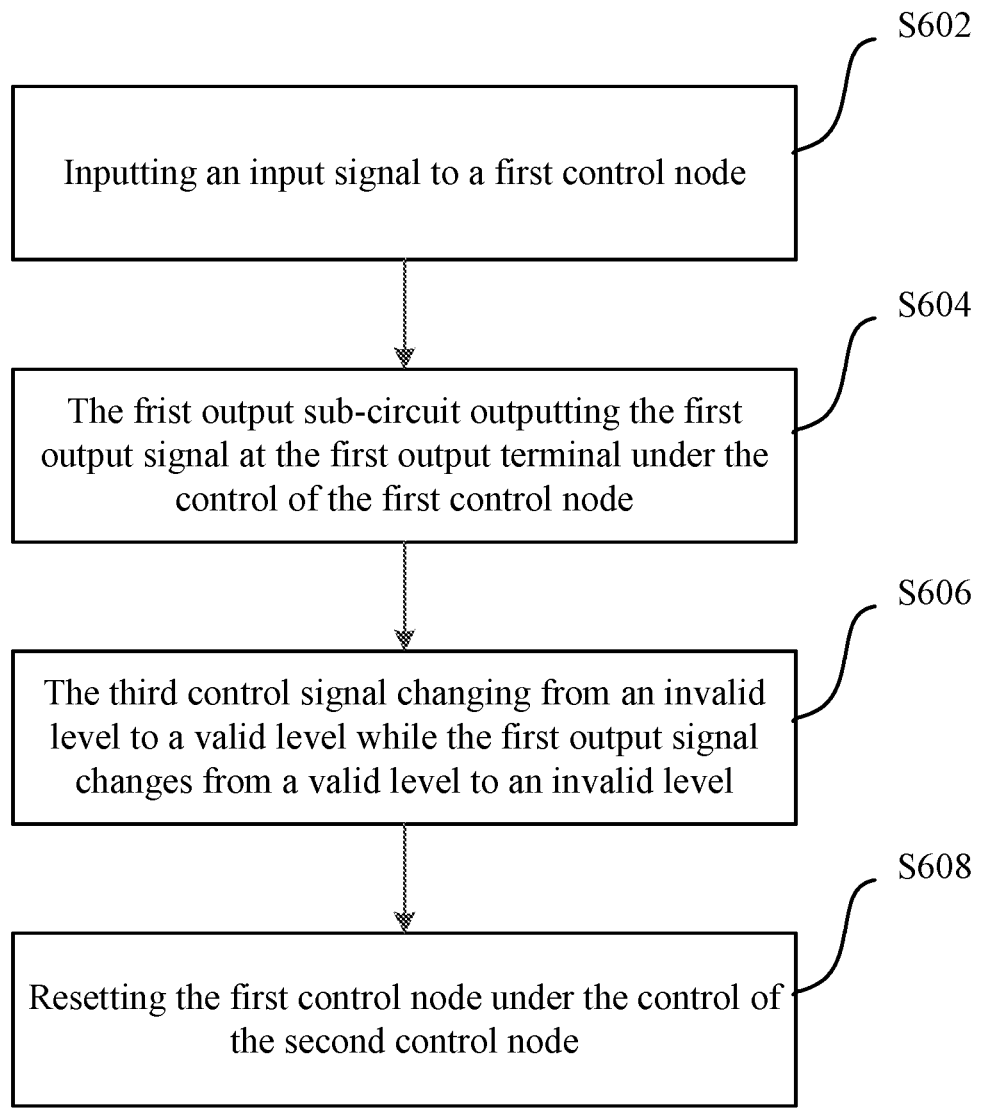
FIG. 6 illustrates a driving method of the shift register unit according to embodiments the present disclosure.

FIG. 6 illustrates a driving method for the above-mentioned shift register unit according to embodiments of the present disclosure. As shown in FIG. 6, in step S602, the shift register unit is in an input stage, and the input signal can be output to the first control node by using the input sub-circuit described above.

In step S604, the shift register unit is in an output stage. Here, under the control of the first control node, the first output sub-circuit outputs a first output signal at a first output terminal, and under the control of the first output terminal, the second output sub-circuit outputs a second output signal opposite to the first output signal at the second output terminal.

In some embodiments, the driving method 600 further includes step S606, in which while the first output signal changes from a valid level to an invalid level, the phase inversion control sub-circuit controls the second output signal output from the second output terminal to change from an invalid level to a valid level under the control of the third control signal. While the first output signal changes from a valid level to an invalid level, the third control signal changes from an invalid level to a valid level.

In some embodiments, the driving method 600 further includes step S608, wherein the first control node is reset under the control of the second control node.

According to the embodiments provided by the present disclosure, by setting the third control signal CK_N, the shift register unit may adopt the phase inversion control sub-circuit to control the second output signal output from the second output terminal GOUT_N to change from an invalid level to a valid level while the first output signal GOUT changes from a valid level to an invalid level, so that the shift register unit can accurately output two output signals with opposite levels.

Figure 7:
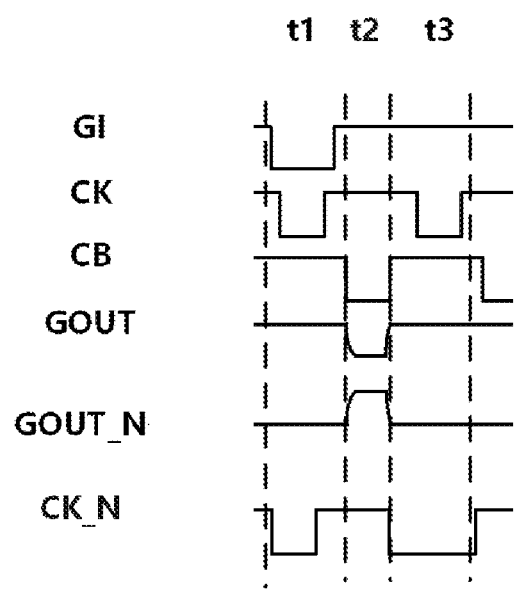
FIG. 7 illustrates the timing sequence of the driving signals for the shift register unit illustrated in FIG. 2 according to embodiments the present disclosure.

FIG. 7 illustrates driving signal timing sequence that can be used in the shift register unit of the embodiment of the present disclosure shown in FIG. 2. In the following, the principle of the present disclosure is introduced by using the shift register unit shown in FIG. 3 as an example.

During an input stage of t1, as shown in FIG. 7, the input terminal GI inputs a low-level input signal, and the terminal of the first control signal CK inputs a low-level control signal, so that the input transistor T1 is turned on under the control of the first control signal CK and input the low-level input signal to the first control node N1 to implement charging of the first output capacitor C1.

During an output stage of t2, the first control signal terminal CK inputs a high-level signal and controls the input transistor T1 to be turned off. At this time, since the first output capacitor C1 is charged in the input stage, the first control node N1 can be maintained at a low level during the t2 stage, and controls the first output transistor T5 to be turned on. The second control signal terminal CB outputs a low-level signal in the t2 stage, thereby the first output terminal GOUT is controlled to output a low-level signal.

Under the control of the low-level signal output from the first output terminal GOUT, the first phase inversion control transistor T9 is turned on. Under the control of the high-level input from the terminal of the third control signal CK_N, the second phase inversion control transistor T10 is turned off. Therefore, at this time, the level of the third control node N5 is pulled up to an invalid high level via the first phase inversion control transistor T9, and the third output transistor T12 is turned off under the control of the third control node N5. At the same time, the second output transistor T11 is turned on under the control of a signal output from the first output terminal GOUT, and outputs a high level to the second output terminal GOUT_N.

During a first reset phase of t3, the second control signal CB changes from a low level to a high level. Accordingly, the signal output from the first output terminal GOUT is also reset from a low level to a high level, which controls the first phase inversion control transistor T9 and the second output transistor T11 to be turned off. At the same time, the third control signal CK_N changes from a high level to a low level, so that the second phase inversion control transistor T10 is turned on under the control of the third control signal CK_N, and outputs a low-level signal to the third control node N5. Thus, the third output transistor T12 is turned on under the control of the third control node N5, and a low-level signal is output to the second output terminal GOUT_N. As can be seen from FIG. 7, based on the above-mentioned timing sequence, the shift register unit provided by the present disclosure can accurately output two signals of opposite levels at the first output terminal and the second output terminal simultaneously.

Figure 8:
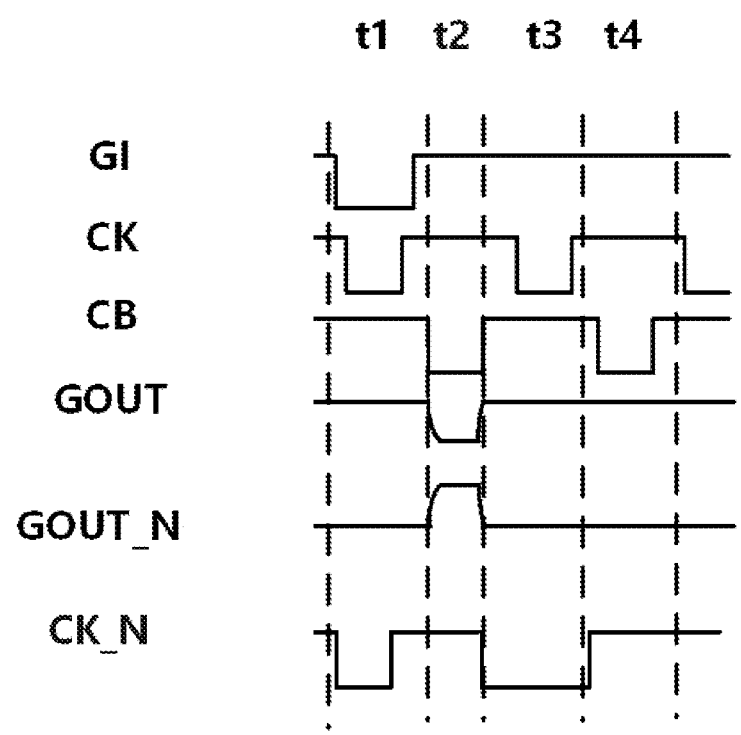
FIG. 8 illustrates the timing sequence of the driving signals for the shift register unit illustrated in FIG. 4 according to embodiments the present disclosure.

FIG. 8 illustrates driving signal timing sequence that can be used in the shift register unit of the embodiments of the present disclosure shown in FIG. 4. In the following, the principle of the present disclosure will be introduced by taking the shift register unit shown in FIG. 5 as an example.

During an input stage of t1, as shown in FIG. 8, the input terminal GI inputs a low-level input signal, and the terminal of the first control signal CK inputs a low-level control signal, so that the input transistor T1 is turned on under the control of the first control signal CK, and inputs the low-level input signal to the first control node N1 to implement charging of the first output capacitor C1.

At this time, the third output control transistor T2 is turned on under the control of the first control node N1, and the first output control transistor T3 is turned on under the control of the first control signal CK and inputs the low-level signal input from the low-level signal terminal to the second control node N2 to implement charging of the output control capacitor C2 and control the second output control transistor T4 to be turned on. A high-level signal can be output to the first output terminal GOUT through T4.

At the same time, the first phase inversion control transistor T9 is turned off under the control of the first output terminal GOUT, and the second output transistor T11 is turned off under the control of the first output terminal GOUT. The third phase inversion control transistor T13 is turned on under the control of the low-level signal VL, and the second phase inversion control transistor T10 is turned on under the control of the third control signal CK_N which is at a low-level, and outputs the low-level signal to the third control node N5. The third output transistor T12 is turned on under the control of the third control node N5, so that a low-level signal is output to the second output terminal GOUT_N through the second output transistor.

In addition, the first reset transistor T6 is turned on under the control of the second control node, and the second reset transistor T7 is turned off under the control of the second control signal.

In an output stage of t2, the terminal of the first control signal CK inputs a high-level signal and controls the input transistor T1 to be turned off. At this time, since the first output capacitor C1 is charged in the input stage, the first control node N1 can be maintained at a low level during the t2 stage, so that the first output transistor T5 is controlled to be turned on. The second control signal terminal CB outputs a low-level signal at the t2 stage, thereby the first output terminal GOUT is controlled to output a low-level signal.

Under the control of the low-level signal output from the first output terminal GOUT, the first phase inversion control transistor T9 is turned on. Under the control of the high-level input from the terminal of the third control signal CK_N, the second phase inversion control transistor is turned off. Therefore, at this time, the level of the third control node N5 is pulled up to an invalid high level through the first phase inversion control transistor T9, and the third output transistor T12 is turned off under the control of the third control node N5. At the same time, the second output transistor T11 is turned on under the control of a signal output from the first output terminal GOUT, and outputs a high level to the second output terminal GOUT_N.

At the same time, the third output control transistor T2 is turned on under the control of the first control node N1, and the high-level signal input by the first control signal is input to the second control node N2, so that the level of the second control node N2 is pulled to a high level, and the second output control transistor T4 is turned off under the control of the second control node N2.

In addition, under the control of the second control node, the first reset transistor T6 is turned off, and under the control of the second control signal, the second reset transistor T7 is turned on.

In the first reset phase of t3, the second control signal CB changes from a low level to a high level. Accordingly, the signal output from the first output terminal GOUT is also reset from a low level to a high level and controls the first phase inversion control transistor T9 and the second output transistor T11 to be turned off. At the same time, the third control signal CK_N changes from a high level to a low level, so that the second phase inversion control transistor T10 is turned on under the control of the third control signal CK_N, and outputs a low level signal to the third control node N5, so that the third output transistor T12 is turned on under the control of the third control node N5, and a low-level signal is output to the second output terminal GOUT_N. At the same time, the second output capacitor C3 can be charged through the level at the third control node N5, so that the level at the third control node N5 can be maintained at a low level. It can be seen from FIG. 8 that, based on the above-mentioned timing sequence, the shift register unit provided by the present disclosure can accurately output two signals of opposite levels at the first output terminal and the second output terminal simultaneously.

In addition, during the period of t3, the first control signal CK changes from a high level to a low level, so that the first output control transistor T3 is turned on under the control of the first control signal and outputs a low level to the second control node N2 and charges the output control capacitor, so that the second output control transistor T4 is turned on under the control of the second control node N2. Through the second output control transistor T4, a high-level signal input from the high-level signal terminal can be output through the first output terminal GOUT.

In addition, under the control of the second control node, the first reset transistor T6 is turned on, and under the control of the second control signal, the second reset transistor T7 is turned off.

In the second reset phase of t4, the terminal of the first control signal CK inputs a high-level control signal, and the terminal of the second control signal CB inputs a low-level control signal, so that the input transistor T1 and the first output control transistor T3 are controlled to be turned off under the control of the first control signal. At this time, due to the charge storage function of the output control capacitor C2, the potential at the second control node N2 can be maintained at a low level, so that the first reset transistor T6 is turned on under the control of the second control node. In addition, the second reset transistor T7 is turned on under the control of the second control signal CB. Therefore, the first control node N1 can be reset through the first reset transistor T6 and the second reset transistor T7, so that the output capacitor C1 can be discharged and the first output sub-circuit is reset.

At this time, because the second output capacitor C3 is charged at the stage t3, the level of the third control node N5 can be maintained at a low level, so that the third output transistor T12 is maintained to be turned on, and the second output terminal can be maintained to output a low level.

In some embodiments, the second output capacitor C3 may be omitted. In case that the second output capacitor C3 is omitted, the third control signal CK_N can be controlled to input a low-level signal at the t4 stage, the second phase inversion control transistor T10 is maintained to be turned on to input a low-level to the third control node N5, and the third output transistor can be turned on under the control of the third control node N5, so that the second output terminal can maintain a low-level output.

Figure 9:
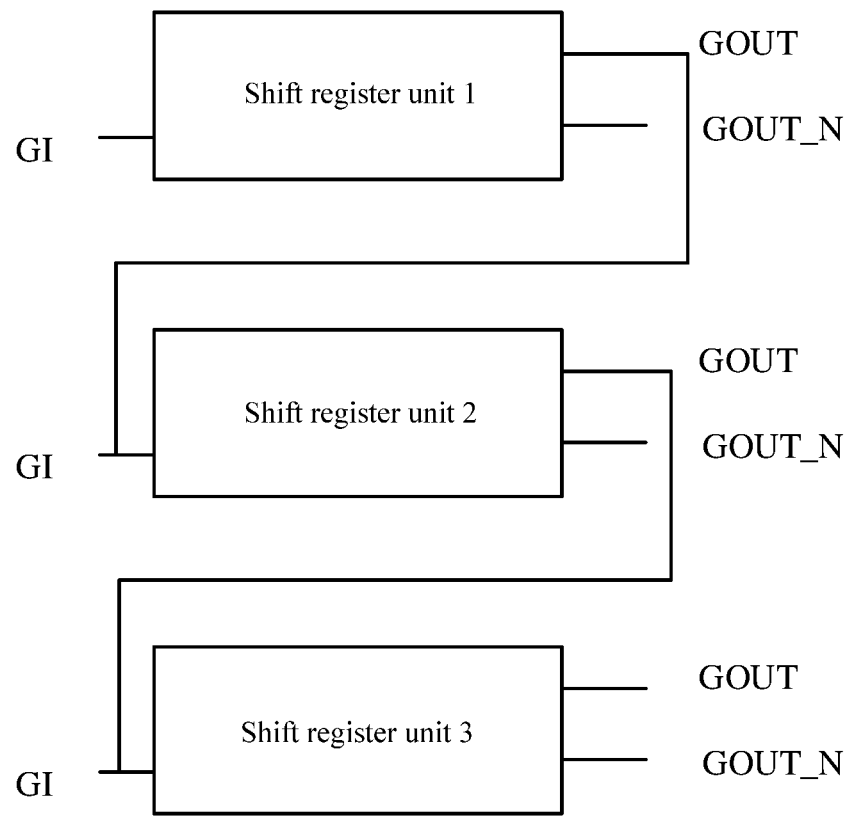
FIG. 9 illustrated a schematic diagram of a gate driving circuit according to embodiments the present disclosure.

FIG. 9 shows a schematic diagram of a gate driving circuit according to embodiments of the present disclosure. As shown in FIG. 9, the gate driving circuit comprises a plurality of shift register units cascaded connected. For example, the gate driving circuit may include N-stages of shift register units cascaded connected, where N is an integer greater than two.

Only three stages of shift register units are shown in FIG. 9, but those skilled in the art can understand that the number of shift register units in the gate driving circuit can be determined according to actual conditions, and no limitation is made on such number in this disclosure.

As shown in FIG. 9, for $1 < i \leq N$, the input terminal of an i-th stage shift register unit is connected to the output terminal of an i-1-th stage shift register unit. That is, in a gate driving circuit composed of cascaded connected shift register units, for each stage shift register unit, its output may be the input of its latter stage shift register unit. For the first stage shift register unit, its input terminal is connected to a frame input signal control line.

At least one embodiment of the present disclosure further provides a display device including the above-mentioned embedded touch screen provided by the embodiments of the present disclosure. The display device may be: a mobile phone, a tablet computer, a television, a display, a notebook computer, a digital photo frame, a navigation device, and any other product or component with display function.

Those skilled in the art should understand that the embodiments of the present disclosure may be implemented as a method, a system, or a computer program product. Therefore, the embodiments of the present disclosure may be in the form of hardware, software, firmware, or any combination thereof. Moreover, the embodiments of the present disclosure may take the form of a computer program product implemented on one or more computer-usable storage media (including but not limited to disk storage, CD-ROM, optical storage, etc.) containing computer-usable program code therein.

The disclosure is described with reference to flowcharts and/or block diagrams of methods, devices (systems), and computer program products according to embodiments of the disclosure. It should be understood that each process and/or block in the flowcharts and/or block diagrams, and combinations of processes and/or blocks in the flowcharts and/or block diagrams can be implemented by computer program instructions. These computer program instructions can be provided to a processor of a general-purpose computer, a dedicated computer, an embedded processor, or other programmable data processing device to obtain a machine, so that instructions executed by the processor of the computer or other programmable data processing device generate for implementation means of the function specified in one block or blocks of the flowchart or block and block diagrams.

These computer program instructions may also be stored in a computer-readable memory capable of directing a computer or other programmable data processing device to work in a particular manner such that the instructions stored in the computer-readable memory produce a manufacture including an instruction device, the instructions device implements the functions specified in one or more flowcharts and/or one or more blocks of the block diagram. These computer program instructions can also be loaded on a computer or other programmable data processing device, so that a series of steps can be performed on the computer or other programmable device to produce a computer-implemented process, so that the instructions executed on the computer or other programmable device provide steps for implementing the functions specified in one or more flowcharts and/or one or more blocks of the block diagrams.

Unless otherwise defined, all terms (including technical and scientific terms) used herein have the same meaning as commonly understood by those skilled in the art to which this disclosure belongs. It should also be understood that terms such as those defined in ordinary dictionaries should be interpreted as having meanings consistent with their meaning in the context of the relevant technology and should not be interpreted in an idealized or highly formal sense unless explicitly stated that here is so defined.

The above is a description of the disclosure and should not be considered as a limitation. Although several exemplary embodiments of the present disclosure have been described, those skilled in the art will readily understand that many modifications can be made to the exemplary embodiments without departing from the novel teachings and advantages of the present disclosure. Accordingly, all such modifications are intended to be included within the scope of this disclosure as defined by the claims. It should be understood that the above is a description of the present disclosure and should not be considered to be limited to the specific embodiments disclosed, and modifications to the disclosed embodiments and other embodiments are intended to be included within the scope of the appended claims. This disclosure is defined by the claims and their equivalents.

What is claimed is:

1. A shift register unit, comprising:
   an input-sub-circuit, having a first terminal connected to an input signal terminal and a second terminal connected to a terminal of a first control signal;
   a first output sub-circuit, having a first terminal connected to a third terminal of the input sub-circuit, a second terminal connected to a terminal of a second control signal, and a third terminal connected to a first output terminal;
   a phase inversion control sub-circuit, having a first terminal connected to the first output terminal, a second terminal connected to a terminal of a third control signal; and
   a second output sub-circuit, having a first terminal connected to the first output terminal, a second terminal connected to a third terminal of the phase inversion control sub-circuit, and a third terminal connected to a second output terminal;
   wherein the second output sub-circuit is configured that when a signal output by the first output sub-circuit changes from a valid level to an invalid level, a signal output by the second output sub-circuit changes from the invalid level to the valid level.

2. The shift register unit according to claim 1, further comprising:
   an output control sub-circuit, having a first terminal connected to the third terminal of the input sub-circuit, a second terminal connected to the terminal of the first control signal, and a third terminal connected to the first output terminal.

3. The shift register unit according to claim 2, further comprising:
   a reset sub-circuit, having a first terminal connected to the third terminal of the input sub- circuit, a second terminal connected to a fourth terminal of the output control sub-circuit.

4. The shift register unit according to claim 3, wherein the reset sub-circuit comprises:
- a first reset transistor, having a control terminal connected to the fourth terminal of the output control sub-circuit, a first electrode connected to a terminal of an invalid level signal; and
- a second reset transistor, having a control terminal connected to the terminal of the second control signal, a first electrode connected to a second electrode of the first reset transistor, and a second electrode connected to the third terminal of the input sub-circuit.

5. The shift register unit according to claim 2, wherein the output control sub-circuit comprises:
- a first output control transistor, having a control terminal connected to the first control signal terminal, a first electrode connected to a terminal of a valid level signal, and a second electrode connected to a fourth terminal of the output control sub-circuit;
- a second output control transistor, having a control terminal connected to the second electrode of the first output control transistor, a first electrode connected to a terminal of an invalid level signal, and a second electrode connected to the first output terminal;
- an output control capacitor, having a first terminal connected to the terminal of the invalid level signal, a second terminal connected to the control terminal of the second output control transistor; and
- a third output control transistor, having a control terminal connected to the third terminal of the input sub-circuit, a first electrode connected to the second electrode of the first output control transistor, and a second electrode connected to the terminal of first control signal terminal.

6. The shift register unit according to claim 1, wherein the phase inversion control sub-circuit comprises:
- a first phase inversion control transistor, having a control electrode connected to the first output terminal, a first electrode connected to a terminal of an invalid level signal, and a second electrode connected to the second output sub-circuit;
- a second phase inversion control transistor, having a control electrode connected to the terminal of the third control signal, a first electrode connected to the second electrode of the first phase inversion control transistor, and a second electrode connected to a terminal of a valid level signal.

7. The shift register unit according to claim 1, wherein the input sub-circuit comprises:
- an input transistor, having a control terminal connected to the terminal of the first control signal, a first electrode connected to the input signal terminal, and a second electrode connected to the first terminal of the first output sub-circuit.

8. The shift register unit according to claim 1, wherein the first output sub-circuit comprises:
- a first output transistor, having a control terminal connected to the third terminal of the input sub-circuit, a first electrode connected to the first output terminal, and a second electrode connected to the terminal of the second control signal;
- a first output capacitor, having a first terminal connected to the first output terminal, a second terminal connected to the control terminal of the first output transistor.

9. The shift register unit according to claim 1, wherein the second output sub-circuit comprises:
- a first output transistor, having a control terminal connected to the first output terminal, a first electrode connected to a terminal of an invalid level signal, and a second electrode connected to the second output terminal; and
- a second output transistor, having a control terminal connected to the third terminal of the phase inversion control sub-circuit, a first electrode connected to the second output terminal, and a second electrode connected to a terminal of a valid level signal.

10. The shift register unit according to claim 9, wherein the second output sub-circuit further comprises:
- a second output capacitor, having a first terminal connected to the second output terminal, and a second terminal connected to the control terminal of the second output transistor.

11. A gate driving circuit having N stages of shift register units cascaded connected, the shift register unit being the shift register unit according to claim 1, wherein,
- an input signal terminal of an i-th stage shift register unit is connected to a first output terminal of an i-1-th stage shift register unit, and N is an integer larger than 2, $1<i\leq N$;
- an input signal terminal of a first stage shift register unit is connected to a frame input signal control line.

12. A display apparatus, comprising the gate driving circuit according to claim 11.

13. A driving method used for the shift register unit according to claim 1, comprising:
- in an input phase, the input sub-circuit outputting an input signal to the first terminal of the first output sub-circuit to charge the first output sub-circuit;
- in an output phase,
- the first output sub-circuit outputting a first output signal at the first output terminal under the control of the third terminal of the input sub-circuit,
- the second output sub-circuit outputting a second output signal having an opposite level to the first output signal at the second output terminal under the control of the first output terminal.

14. The driving method according to claim 13, wherein the shift register unit further comprises an output control sub-circuit, having a first terminal connected to the third terminal of the input sub-circuit, a second terminal connected to the first control signal terminal, and a third terminal connected to the first output terminal; and a reset sub-circuit, having a first terminal connected to the third terminal of the input sub-circuit, a second terminal connected to a fourth terminal of the output control sub-circuit, and the driving method further comprises:
- in a first reset phase, the phase inverse control sub-circuit controlling the second output signal output from the second output terminal to change from the invalid level to the valid level while the first output signal changes from the valid level to the invalid level, wherein the third control signal changes from the invalid level to the valid level while the first output signal changes from the valid level to the invalid level; and
- in a second reset phase, resetting the first output sub-circuit under the control of the fourth terminal of the output control sub-circuit.

* * * * *